United States Patent [19]
Leiby

[11] Patent Number: 5,973,566
[45] Date of Patent: Oct. 26, 1999

[54] DISCRETE STEP VARIABLE GAIN INVERTING AMPLIFIER WITH CONSTANT RATIO BETWEEN ADJACENT GAINS

[75] Inventor: Robert W. Leiby, Ft. Collins, Colo.

[73] Assignee: Hewlett Packard Company, Palo Alto, Calif.

[21] Appl. No.: 09/052,880

[22] Filed: Mar. 31, 1998

[51] Int. Cl.[6] .................................................. H03G 3/12
[52] U.S. Cl. ........................... 330/282; 330/284; 330/278
[58] Field of Search .................................... 330/278, 284, 330/282, 86

[56] References Cited

U.S. PATENT DOCUMENTS

| | | | |
|---|---|---|---|
| 4,132,957 | 1/1979 | Hekimian et al. | 330/282 |
| 4,500,845 | 2/1985 | Ehni | 330/282 |
| 5,721,513 | 2/1998 | Yuasa | 330/282 |

Primary Examiner—Michael B Shingleton
Attorney, Agent, or Firm—Edward L Miller

[57] ABSTRACT

An inverting amplifier having variable gain in M discrete steps that are a fixed ratio F apart may be constructed by grounding the non-inverting input of a high gain differential gain element, and connecting the inverting input through a single-pole M-throw switch to the $N^{th}$ terminal in a ladder network of M cascaded elements. Each element is a series R and X, with X grounded, and their junction being where the next element of the ladder is connected. These junctions are also the aforementioned terminals of the ladder network, and are what are coupled to the M throws of the switch. At an input end of the ladder network is another impedance Z, to which the input $V_{in}$ is applied. At the other end of the ladder network is a final R in series with another Z that is driven by the $V_{out}$ obtained from the output of the gain element. Once Z and F are selected R and X may be found according to the relationships $R=Z[\sqrt{(1/F)}-1]$ and $X=Z[\sqrt{(1/F)}]/[\sqrt{(1/F)}-1]$. FET's may used to provide a make before break switch. The setting of the switch picks N, which determines the variable gain.

3 Claims, 4 Drawing Sheets

DISCRETE STEP VARIABLE GAIN INVERTING AMPLIFIER WITH CONSTANT RATIO BETWEEN ADJACENT GAINS

BACKGROUND OF THE INVENTION

Every so often a design calls for an inverting amplifier of gain that is variable in discrete steps related by a constant factor, say two. That is, an inverting amplifier that might have, perhaps eight, nine or ten different gains, with each successive one a factor of two different from its predecessor. The lowest of these gains might be actual amplification, unity gain, or even attenuation. That is, the lowest gain setting might be a gain of ⅛, a gain of unity, or a gain of two. Each higher gain would be a gain of twice as much. Of course, the use of two as the ratio between consecutive steps is merely illustrative. In principle the ratio can be any practical (in the ordinary sense of the word) value, as can be the number of steps of gain.

There are at least two prior art circuits which have been used in this sort of service, and each has at least one disadvantage. For example, the circuit shown in FIG. 1A requires very tight tolerances on the resistors if the gains are to vary by a wide margin, say $2^{10}$. The circuit can only produce gain, and not attenuation. Another disadvantage of this circuit is that it is not naturally inverting, and an additional stage is needed to accomplish inversion. The circuit of FIG. 1B in an inverting circuit, but imposes stringent requirements on the switching network. Field Effect Transistors (FET's) are usually used (arranged as form C switches), and circuit operation is affected by variations in ON resistance and by leakage.

There is yet another prior solution, which is to simply precede a high gain amplifier with an attenuator. This is a very brute force solution that has the disadvantage that the gain of the amplifier must be stable and precise, the amplifier must always operate at maximum gain (which is probably also maximum power dissipation), and there needs to be precision high ratios of resistance values in the attenuator.

The difficulties associated with the issues of resistor tolerance, and of maintaining precise ratios and temperature coefficients for resistors of values over a wide range, become more understandable when it is remembered that it is often necessary to fabricate the resistors using either thin or thick film processes as part of a hybrid integrated circuit process. This type of implementation imposes these constraints today in a way that simply was not as painful back when the designer would (probably could only) use a Teflon rotary switch and hand selected individual precision resistors.

It would be desirable if there were an inverting variable gain amplifier circuit having discrete gains with a constant ratio between adjacent gains, but that did not require high tolerances of the resistances nor heroic performance from the FET switches. Such a circuit would lend itself to economical and reliable production using the available standard fabrication techniques for hybrid integrated circuits.

SUMMARY OF THE INVENTION

An inverting amplifier having variable gain in M discrete steps that are a fixed ratio F apart may be constructed by grounding the non-inverting input of a high gain differential gain element, and connecting the inverting input through a single-pole M-throw switch to the $N^{th}$ terminal in a ladder network of M cascaded elements. Each element is a series R and X, with X grounded, and their junction being where the next element of the ladder is connected. These junctions are also the aforementioned terminals of the ladder network, and are what are coupled to the M throws of the switch. At an input end of the ladder network is another impedance Z, to which the input $V_{in}$ is applied. At the other end of the ladder network is a final R in series with another Z that is driven by the $V_{out}$ obtained from the output of the gain element. Once Z and F are selected R and X may be found according to the relationships $R=Z[\sqrt{(1/F)}-1]$ and $X=Z[\sqrt{(1/F)}]/[\sqrt{(1/F)}-1]$. FET's may used to provide a make before break switch. The setting of the switch picks N, which determines the variable gain.

DESCRIPTION OF A PREFERRED EMBODIMENT

Figure 1A:
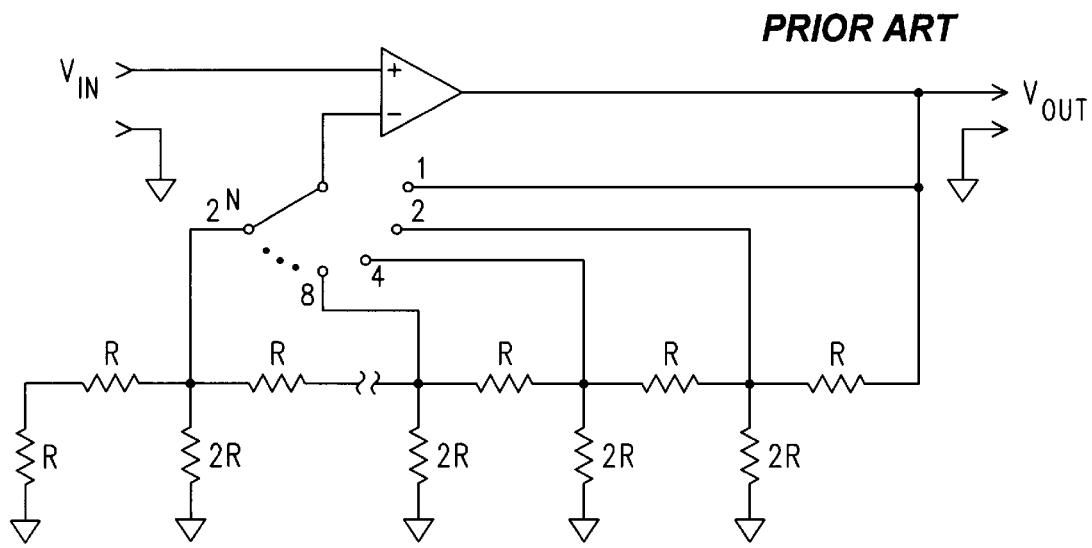
FIGS. 1A and B are prior art amplifier circuits having constant ratios between multiple gains.
Figure 1B:
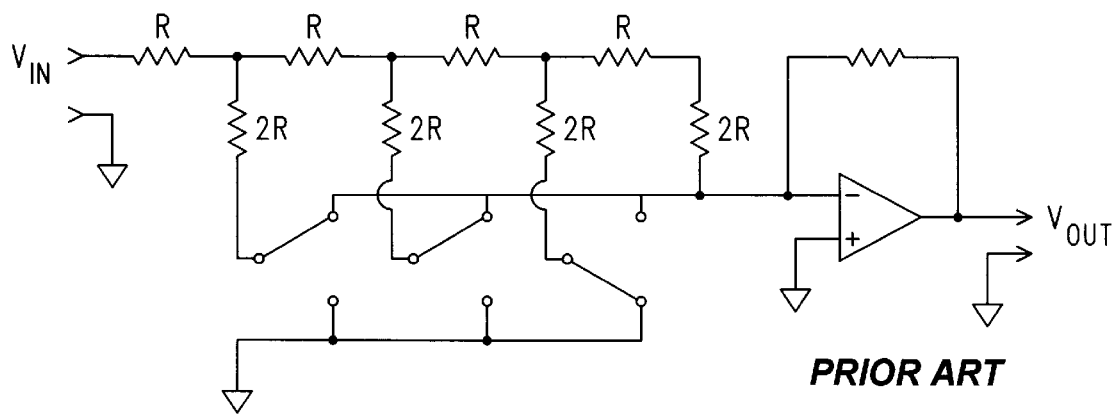
Figure 2:
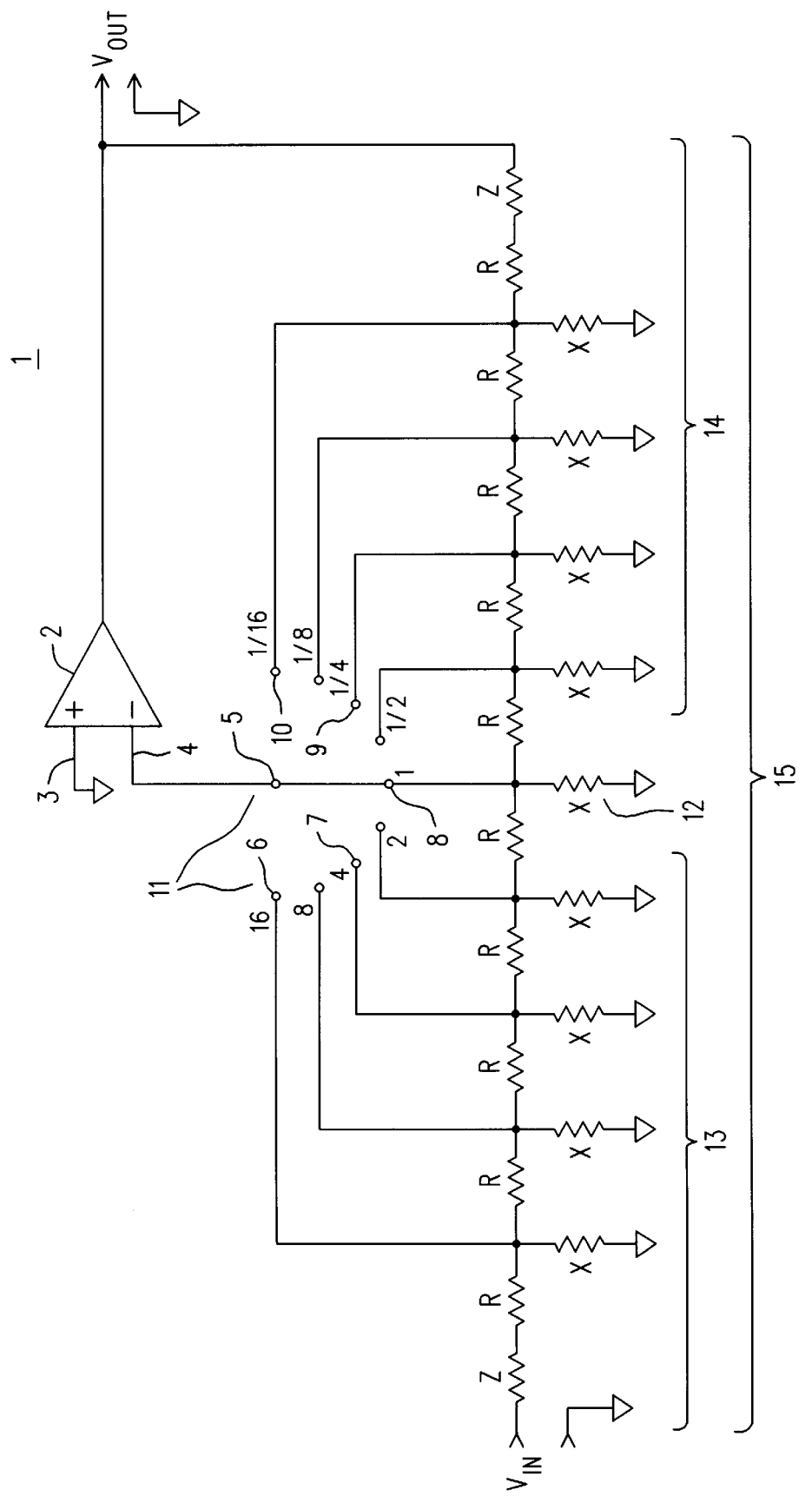
FIG. 2 is a simplified schematic diagram of an inverting variable gain amplifier having discrete gains with a constant ratio between adjacent gains.

Refer now to FIG. 2, wherein is shown an illustrative schematic diagram of an inverting amplifier 1 constructed according to the invention. As shown in the figure, a high gain differential amplifier element 2 (think: a suitable operational amplifier, or op amp) with a non-inverting (+) 3 input and an inverting (−) 4 input has its non-inverting input 3 connected to a signal ground. It will be understood, of course, that in an actual implementation the non-inverting input 3 might be connected to some DC offset for other reasons, and perhaps also through a suitable bypass to a signal ground.

The inverting (−) input 4 is connected to the "moveable" pole 5 of a multiple throw switch 11. In the example circuit 1 of the figure there are nine throws that are respectively connected to consecutive nodes in a resistive ladder network for controlling the gain of the amplifier. For instance, when the wiper of the switch connects pole 5 to throw 10 the circuit has a gain of ¹⁄₁₆ (i.e., it functions as an attenuator). When pole 5 is connected to throw 9 there is a gain of ¼. Connecting pole 5 to throw 8 provides unity gain. Connecting pole 5 to throw 7 results in a gain of four, while connecting it to throw 6 results in a gain of sixteen. It will be understood and appreciated, of course, that while the circuit could be implemented using a real rotary switch, as is suggested by the figure, the preferred method of switching is with FET's. Likewise, the present circuit shows particular gains ranging from ¹⁄₁₆ to 16, which is merely exemplary. The factor relating the different gains need not be the value two that is used in our example (it might be any reasonable number, and not necessarily an integer), and the number of steps is a matter of choice, as moderated only by ordinary practicality.

That the circuit 1 is capable of gains both less than and greater than unity is not surprising. What is interesting is how to get an arbitrary number (M) of steps, a fixed gain ratio per step, all the while using only three different values of resistance: Z (two instances), R (M+1 instances) and X (M instances). From a hybrid designer's perspective, what is attractive here is that a common process can be used to fabricate all the resistances, there are not huge variations (e.g., 1 M Ω) and 1 Ω) between those resistances, and that circuit operation is more influenced by the ratio between the resistors than by their actual factual ohmic value. This means, for example, that certain process parameters in manufacturing might be relaxed in favor of good ratios. Good ratios are often easier to maintain than absolute ohmic outcomes.

Figure 3:
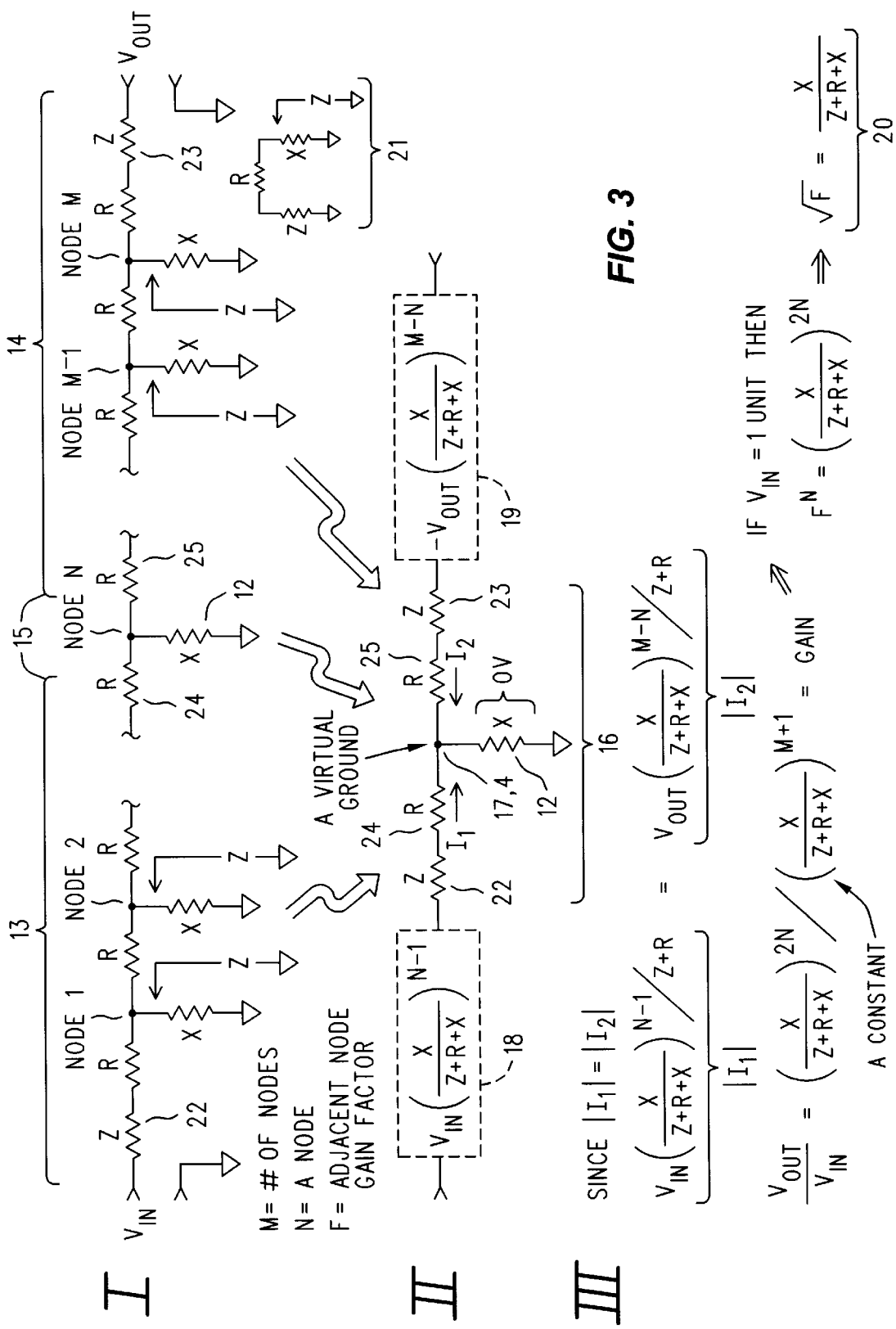
FIG. 3 is a schematic diagram and related derivation useful in understanding the operation of the amplifier of FIG. 2.

Before we turn to FIG. 3 for a brief explanation what makes this particular amplifier topology work the way it does, note from FIG. 2 that inverting input 4 of the gain element 2 is a virtual ground. Also note how the ladder network 15 of Z's, R's and X's has been divided into a $V_{in}$ portion 13, a middle portion 12 that is the X selected by the tap of the switch 11, and a $V_{out}$ portion 14. Because of the virtual ground there will be essentially no voltage across the middle X 12.

And now on to FIG. 3, which is divided into three parts: I–III. The tasks of part I are to label the pieces 12, 13 and 14 of the ladder network 15 and assist with the following idea, illustrated by the schematic segment 21. If X, R and Z are chosen properly, then the impedance of the pi network 21 is simply Z. Assuming that this condition can be met (and it is well known that it can), it provides the basis for easily reducing the ladder network 15 to its Thevenin equivalent 16 in part II of the figure. In satisfying herself of this, the reader is asked to note that the source impedances of $V_{in}$ and $V_{out}$ are assumed to be small enough to be ignored, and that to terminate an otherwise endless substitution with a finite one is why the series Z values 22 and 23 are present. She should also note that R's 24 and 25 are not subsumed in the reduction, but remain for inclusion in the equivalent 16. Middle resistance X 12 conveniently vanishes, however, assuming that the servoing action of the amplifier configuration does its job; recall that middle X 12 is between a virtual ground and an actual ground.

Part II of FIG. 3 is the Thevenin equivalent circuit, expressed in terms of the overall number of nodes (switch positions of switch 11) M, the selected node (representing a desired gain), and the values Z, R and X. Note that the absolute value of $I_1$ equals the absolute value of $I_2$, as a direct consequence of the virtual ground.

Part III uses the resources of part II and forms the usual E/R representation of I to set $I_1$ equal to $I_2$. After that things are rearranged to get an expression for GAIN in terms of a unit input. But that is also $F^N$, where F is the ratio between adjacent steps for gain, so that $F^N$ must the GAIN when switch 11 is set to node N. When all the dust settles we see that:

$$\sqrt{F}=X/(Z+R+X) \qquad \text{eq. (1)}$$

The designer knows what she wants F to be (we wanted F=2), which picks its square root. Now what is required is to solve for Z, X and R based on other relationships. Another relationships we can get comes from schematic segment 21 of part I of FIG. 3:

$$Z=[(Z+R)X]/(Z+R+X) \qquad \text{eq. (2)}$$

Now pick a convenient Z. One can now solve eq's (1) and (2) for R and X. After a mere a dozen or so lines of algebra (happily omitted for brevity) it may be shown that:

$$R=Z[\sqrt{(1/F)}-1] \qquad \text{eq. (3)}$$

And after just another four lines:

$$X=Z[\sqrt{(1/F)}]/[\sqrt{(1/F)}-1] \qquad \text{eq. (4)}$$

So, after our designer picks F and Z, she can find R and X as shown. A note is in order for picking F. We have described it as the ratio of gains for adjacent settings of the switch. This neglects the direction the switch is moved. For increasing gain we have used an example of F=2. But one could in the exact same circuit simply move the switch in the other direction. On this view F=½. This is not a problem, and the equations do not care, since F=2 represents an increase in gain and F=½ represents a decrease in attenuation.

As an example, suppose we let Z+R=50 Ω. This picks a minimum value for the input impedance to the ladder. Now suppose we select a step size of F=½. We can now find that:

Z=35.4 Ω,

R=14.6 Ω and

X=120.7 Ω.

Now, there are just a few more issues that should be mentioned for the sake of completeness. First, the designer is urged to consider the wisdom of making the switch 11 be of the make before break variety. This is to keep the gain element 2 from going to the rails during switching. The momentary deviation from an ideal transition in gain by the factor F owing to a segment of the ladder being temporarily shorted out is probably a small price to pay to avoid the recovery time needed if the (−) input 4 to the op amp 2 is open circuited even briefly.

Figure 4:
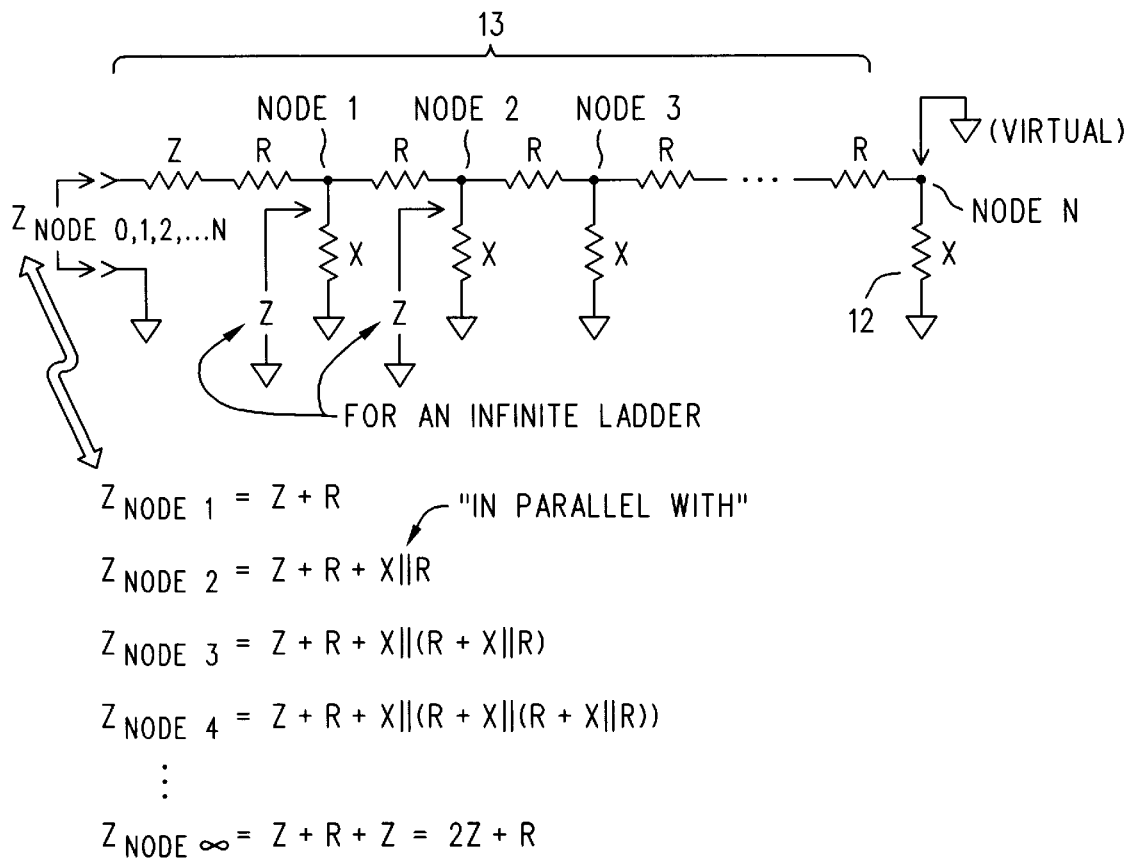
FIG. 4 is a schematic diagram and derivation useful in understanding the input impedance of the amplifier of FIG. 2.

Next, it must be confessed that the circuit 1 of FIG. 2 does not have an altogether constant input impedance. Refer now to FIG. 4 for the details; the figure illustrates the changing input impedance of an increasingly longer ladder, and is believed to speak for itself.

I claim:

1. An inverting amplifier circuit comprising:

a ladder network having plurality of consecutive stages, each stage comprising an input terminal and an output node, a resistance R between the input terminal and the output node and a resistance X between the output node and a signal ground, the input terminal of each successive stage being connected to the output node of the preceding stage;

the ladder network having an input stage that is a first stage in the consecutive plurality thereof and an output stage that is preceded by all other stages in the ladder;

a resistance Z coupled between a $V_{in}$ input terminal that receives a work signal to be amplified and the input terminal of the input stage;

a series combination of resistances totaling R+Z coupled between a $V_{out}$ output terminal and the output node of the output stage;

a multiple throw switch comprising a pole connectable to a selected throw, each throw being connected to an output node;

an inverting differential amplifier having a non-inverting input coupled to the signal ground and an inverting input coupled to the pole of the multiple throw switch, and an amplifier output coupled to the $V_{out}$ output terminal; and the values of R and X being selected to produce a constant ratio Vin/Vout as the pole of the multiple throw switch is moved between throws connected to consecutive output nodes, and the value of Z being essentially Z=[(Z+R)X]/(Z+R+X).

2. An inverting amplifier circuit as in claim 1 wherein the multiple throw switch makes a new connection before breaking an old one.

3. An inverting amplifier circuit as in claim 1 wherein $V_{out}$ is an amplification of $V_{in}$ when the pole of the multiple throw switch is connected to at least one output node and is an attenuation of $V_{in}$ when connected to at least one other output node.

* * * * *